United States Patent
Kim et al.

(10) Patent No.: US 9,461,665 B1
(45) Date of Patent: Oct. 4, 2016

(54) SUCCESSIVE APPROXIMATED REGISTER ANALOG-TO-DIGITAL CONVERTER AND CONVERSION METHOD THEREOF

(71) Applicant: Korea University Research and Business Foundation, Seoul (KR)

(72) Inventors: Chulwoo Kim, Seoul (KR); Sejin Park, Seoul (KR)

(73) Assignee: Korea University Research and Business Foundation, Seoul (KR)

( * ) Notice: Subject to any disclaimer, the term of this patent is extended or adjusted under 35 U.S.C. 154(b) by 0 days.

(21) Appl. No.: 14/837,049

(22) Filed: Aug. 27, 2015

(30) Foreign Application Priority Data

Aug. 24, 2015 (KR) .................. 10-2015-0119136

(51) Int. Cl.
*H03M 1/46* (2006.01)
*H03M 1/06* (2006.01)

(52) U.S. Cl.
CPC ........... *H03M 1/462* (2013.01); *H03M 1/0607* (2013.01); *H03M 1/468* (2013.01)

(58) Field of Classification Search
CPC ........ H03M 1/38; H03M 1/46; H03M 1/462; H03M 1/466; H03M 1/468
See application file for complete search history.

(56) References Cited

U.S. PATENT DOCUMENTS

| 7,696,918 B2 * | 4/2010 | Kuramochi | H03M 1/125 341/155 |
| 8,482,449 B1 * | 7/2013 | Zabroda | H03M 1/0863 341/118 |
| 8,599,059 B1 * | 12/2013 | Chung | H03M 1/466 341/163 |
| 8,896,476 B2 * | 11/2014 | Harpe | H03M 1/02 341/118 |
| 8,957,805 B2 * | 2/2015 | Niwa | H03M 1/1023 341/118 |

FOREIGN PATENT DOCUMENTS

| KR | 20110108563 A | 10/2011 |
| KR | 20130015859 A | 2/2013 |
| KR | 10-201-30015859 | * 4/2013 |

OTHER PUBLICATIONS

Lu Yuxiao et al., A single-channel 10-bit 160 MS/s SAR ADC in 65 nm CMOS, Journal of Semiconductors, vol. 35, No. 4, Apr. 2014, Chinese Institute of Electronics.*

* cited by examiner

*Primary Examiner* — Howard Williams
(74) *Attorney, Agent, or Firm* — Fox Rothschild LLP; Peter J. Butch, III; Carol E. Thorstad-Forsyth

(57) ABSTRACT

A Successive Approximated Register Analog-to-Digital Converter ("SARADC") is provided that includes: a bootstrapping unit that receives and samples analog signals; and an Analog-to-Digital Conversion Unit ("ADCU") that converts the analog signals into digital signals and outputs the digital signals. ADCU has a resolution increasing in response to an intentionally injected offset voltage. In this case, ADCU includes Capacitor Arrays ("CAs") having: a differential structure each including reference voltage application capacitors having different capacitances and an Offset Voltage Injection Capacitor ("OVIC"); a delay cell that operates CAs in an asynchronous mode; Reference Transfer Switch Units ("RTSUs") that apply a reference voltage to CAs; a comparator that compares output voltages of CAs; and Successive Approximated Register Logics ("SARLs"). SARLs control operations of RTSUs in response to an output signal of the comparator and perform control so that a reference voltage is applied to OVICs when the output of the comparator is abnormal.

11 Claims, 7 Drawing Sheets

3(a)

3(b)

4(a)

4(b)

5(a)

5(b)

6(a)

6(b)

7(a)          7(b)

us 9,461,665 B1

SUCCESSIVE APPROXIMATED REGISTER ANALOG-TO-DIGITAL CONVERTER AND CONVERSION METHOD THEREOF

CROSS-REFERENCE TO RELATED APPLICATION

This application claims priority to and the benefit of Korean Patent Application No. 10-2015-0119136, filed on Aug. 24, 2015, the disclosure of which is incorporated herein by reference in its entirety.

BACKGROUND

1. Field of the Invention

The present invention relates to a successive approximated register analog-to-digital converter and a conversion method thereof, and more particularly, to a successive approximated register analog-to-digital converter and a conversion method thereof capable of improving performance while reducing power consumption.

2. Discussion of Related Art

Digital signal processing is more advantageous than analog signal processing due to its characteristics of high data processing speed and imperviousness to environmental noise. However, since most signals present in nature are in an analog form, it is necessary to convert an input analog signal to a digital signal in an integrated circuit.

Analog-to-digital converters may be generally classified into a pipeline analog-to-digital converter, a successive approximated register analog-to-digital converter, a flash analog-to-digital converter, and a delta-sigma analog-to-digital converter. The analog-to-digital converter has a suitable structure according to a sampling rate and a resolution.

Among these, the successive approximated register analog-to-digital converter has an advantage in that power consumption is much lower than that of analog-to-digital converters having different structures due to its high dependence on digital circuits. However, an output with a resolution of a certain level or higher in a conventional successive approximated register analog-to-digital converter is limited due to mismatch of an adjacent capacitor due to a change in a process of a capacitor digital-to-analog converter, and an insufficient resolution of the comparator.

Accordingly, recently, technology for improving a resolution of an analog-to-digital converter while using the same comparator has been actively studied. Examples of the technology include a majority voting scheme based on a theory of probability, an oversampling scheme for increasing a sampling rate to cause noise to be distributed over a wide band, resulting in low noise, and technology for intentionally continuously applying a specific pattern to a capacitor digital-to-analog converter to reduce noise. However, the majority voting scheme has a disadvantage in that a cycle of 5 clocks should be used in order to additionally obtain 1 bit, and the oversampling scheme has a disadvantage in that an input frequency band of an analog-to-digital converter is limited.

As the related art, there is Korean Patent Publication No. 10-1253224 (Title: Analog-to-digital Converter).

SUMMARY OF THE INVENTION

The present disclosure is directed to a successive approximated register analog-to-digital converter and a conversion method thereof that increase a resolution of an analog-to-digital converter while minimizing addition of a clock cycle.

Further, the present disclosure is directed to a successive approximated register analog-to-digital converter and a conversion method in which power consumption is reduced by intentionally applying an offset voltage, detecting a result of the application, and extending a resolution of a comparator.

In order to achieve the above object, a successive approximated register analog-to-digital converter provided in the present disclosure includes: a bootstrapping unit that receives and samples first and second analog signals; and an analog-to-digital conversion unit that converts the first and second analog signals into digital signals and outputs the digital signals. The analog-to-digital conversion unit has a resolution increasing in response to an intentionally injected offset voltage.

In some scenarios, the analog-to-digital conversion unit may include: capacitor arrays having a differential structure each including a plurality of reference voltage application capacitors having different capacitances and an offset voltage injection capacitor; a delay cell that operates the capacitor arrays having a differential structure in an asynchronous mode; reference transfer switch units that apply a reference voltage to the capacitor arrays; a comparator that compares output voltages of the capacitor arrays; and successive approximated register logics that control operations of the reference transfer switch units in response to an output signal of the comparator, and perform control so that a predetermined voltage is applied to the offset voltage injection capacitors when the output of the comparator is abnormal.

In some scenarios, the reference transfer switch unit may include a plurality of switches corresponding to the plurality of reference voltage application capacitors and the offset voltage injection capacitor. The plurality of switches may selectively connect the corresponding capacitors to a reference voltage or a common mode voltage in response to a control signal from the successive approximated register logics.

In those or other scenarios, the successive approximated register logics may control an operation of the reference transfer switch unit so that a reference voltage is applied to a bottom plate of the offset voltage injection capacitor.

In those or other scenarios, the successive approximated register logics may determine that an output signal of the comparator is abnormal when the output signal of the comparator is not generated for a predetermined comparator operating time.

In those or other scenarios, the successive approximated register logics may inject an offset voltage a preset number of times per cycle.

In those or other scenarios, the successive approximated register logics may obtain a voltage value at which a bit error rate (BER) according to a value of the offset voltage is close to 0, and perform control so that the voltage value is applied as the offset voltage.

Meanwhile, in order to achieve the above object, an analog-to-digital conversion method provided in the present disclosure is an analog-to-digital conversion method using a successive approximated register analog-to-digital converter including capacitor arrays having a differential structure. The method includes: a step of sampling first and second analog signals for the capacitor arrays having a differential structure in response to the input of the first and second analog signals; a first comparison step of comparing sampled differential signals to each other; a second comparison step of injecting an offset voltage into the sampled signal when a result of the comparison is abnormal, and then performing comparison with a predetermined voltage again;

and a step of outputting a digital signal in response to a result of the first or second comparison.

In some scenarios, the first comparison step may include comparing top plate voltages of the capacitor arrays having a differential structure, and outputting a result of the comparison.

In those or other scenarios, the second comparison step may include applying a reference voltage to a bottom plate of the offset voltage injection capacitor.

In those or other scenarios, the second comparison step may include determining that a result of the comparison is abnormal when the result of the comparison is not generated for a standby time as a result of predetermined comparison.

In those or other scenarios, the second comparison step may be repeatedly performed a preset number of times per cycle.

In those or other scenarios, the method may further include a step of obtaining a voltage value at which a bit error rate (BER) according to a value of the offset voltage is close to 0. The second comparison step may include applying the obtained voltage value as the offset voltage.

The systems discussed in the present disclosure have an advantage in that power consumption of a comparator that is an important part in the analog-to-digital converter can be significantly reduced by intentionally applying the offset voltage to a capacitor digital-to-analog converter of the successive approximated register analog-to-digital converter and detecting a result of the application. Accordingly, power consumption of an entire system, that is, the entire successive approximated register analog-to-digital converter, can be reduced. For example, when the analog-to-digital converter having a resolution of 12 bits is implemented using a 10-bit comparator, the analog-to-digital converter can be implemented by adding only a 4-clock cycle, unlike the 10-bit analog-to-digital converters. Thus, the present systems have an advantage in that the resolution of the analog-to-digital converter can be increased by adding only a minimal clock cycle.

BRIEF DESCRIPTION OF THE DRAWINGS

The above and other objects, features and advantages of the present invention will become more apparent to those of ordinary skill in the art by describing in detail exemplary embodiments thereof with reference to the accompanying drawings, in which.

DETAILED DESCRIPTION OF EXEMPLARY EMBODIMENTS

Figure 1:
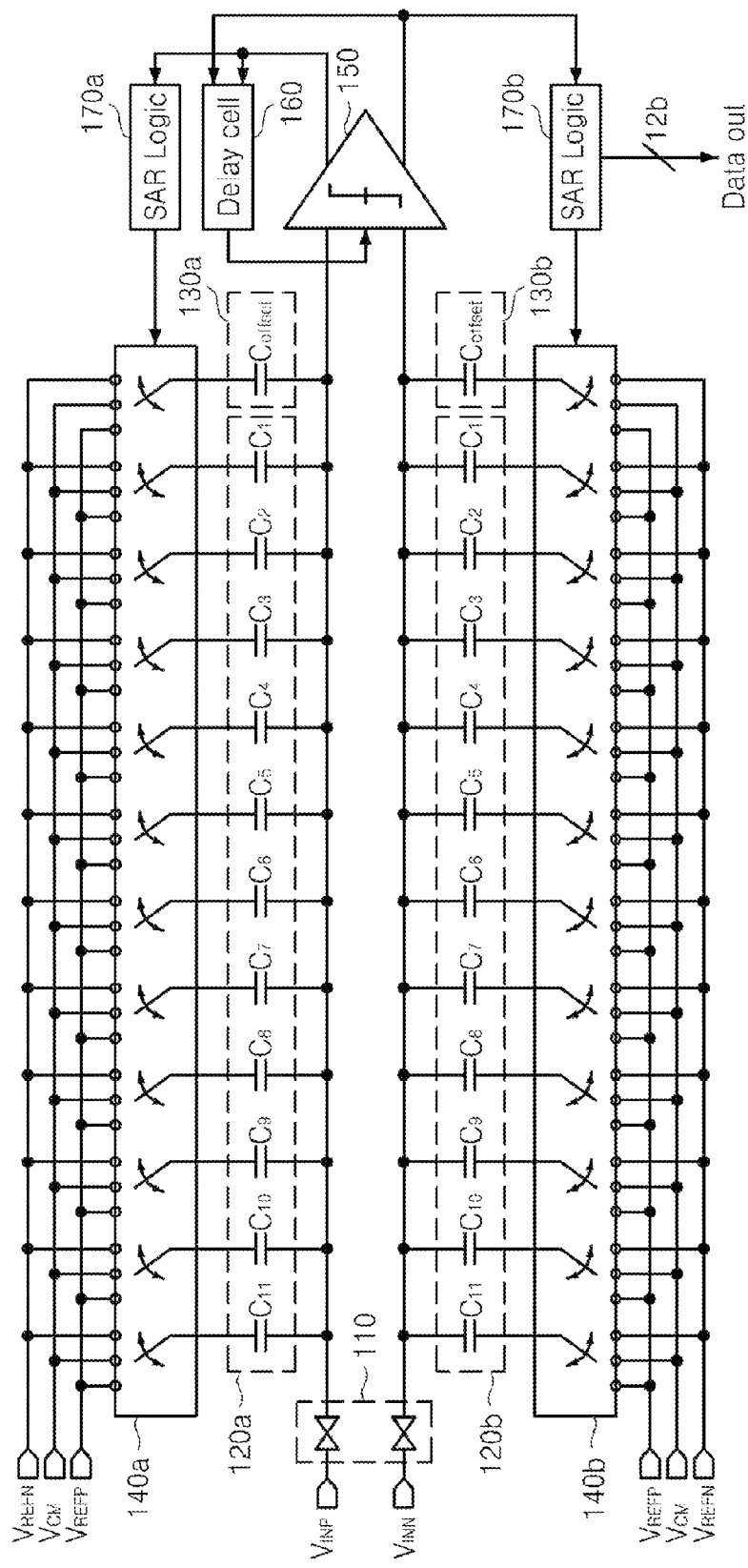
FIG. 1 is a schematic circuit diagram of a successive approximated register analog-to-digital converter.

Hereinafter, embodiments of the present invention will be described in detail with reference to the accompanying drawings so that the present invention can be easily implemented by those skilled in the art. However, the present invention may be implemented in several different forms, but is not limited to the embodiments described herein.

Meanwhile, portions not related to the description will be omitted in the drawings in order to clearly describe the present invention, and similar portions in the specification are denoted with similar reference numerals. Further, description of portions that can be easily understood by those skilled in the art without a detailed description will be omitted.

When a certain portion includes any component in the specification and claims, unless otherwise mentioned, other components are not necessarily excluded from the portion but may be further included.

FIG. 1 is a schematic circuit diagram of a successive approximated register analog-to-digital converter. Referring to FIG. 1, the successive approximated register analog-to-digital converter includes a bootstrapping unit 110, capacitor arrays having a differential structure including a plurality of voltage application capacitors 120a and 120b and offset voltage injection capacitors 130a and 130b, reference transfer switch units 140a and 140b, a comparator 150, a delay cell 160, and successive approximated register logics (SAR Logics) 170a and 170b.

The bootstrapping unit 110 receives an analog signal applied from the outside as an input. That is, the bootstrapping unit 110 is implemented to be paired as illustrated in FIG. 1, receives first and second analog signals INP and INN that are differential signals as inputs, and samples the first and second analog signals INP and INN for the capacitor arrays having a differential structure. For this, the bootstrapping unit 110 directly applies the first and second analog signals INP and INN to a top plate of the capacitors 120a, 120b, 130a, and 130b ($C_{11}$, $C_{10}$, $C_9$, $C_8$, $C_7$, $C_6$, $C_5$, $C_4$, $C_3$, $C_2$, $C_1$, and $C_{offset}$) that constitute the capacitor arrays having a differential structure, and the reference transfer switch units 140a and 140b applies a common mode voltage to a bottom plate. This is for the purpose of top plate sampling. In the example of FIG. 1, a case in which the first and second analog signals INP and INN are subjected to top plate sampling is exemplified. However, the present invention is not limited to a top plate sampling scheme. That is, other known sampling schemes (for example, bottom plate sampling) can be applied.

Meanwhile, the capacitor arrays having a differential structure including the plurality of voltage application capacitors 120a and 120b ($C_{11}$, $C_{10}$, $C_9$, $C_8$, $C_7$, $C_6$, $C_5$, $C_4$, $C_3$, $C_2$, and $C_1$) and the offset voltage injection capacitors ($C_{offset}$) 130a and 130b, the reference transfer switch units 140a and 140b, the comparator 150, the delay cell 160, and the successive approximated register logics (SAR Logics) 170a and 170b constitute an analog-to-digital converter for converting the first and second analog signals INP and INN into a digital signal and outputting the digital signal. The analog-to-digital conversion unit configured as above has a characteristic that its resolution increases in response to an intentionally injected offset voltage. In FIG. 1, an example in which the capacitor arrays having a differential structure are implemented with 11 bits is illustrated in order to describe an example in which the resolution of the analog-to-digital converter increases from 10 bits to 12 bits. That is, a bit number of the capacitor arrays having a differential structure described herein is not limited to the 11 bits illustrated in FIG. 1.

The plurality of voltage application capacitors 120a and 120b ($C_{11}$, $C_{10}$, $C_9$, $C_8$, $C_7$, $C_6$, $C_5$, $C_4$, $C_3$, $C_2$, and $C_1$) have different capacitances. The capacitor having the great capacitance is selected and operated in order to convert an input analog signal to a digital signal.

The reference transfer switch units 140a and 140b apply a reference voltage to the capacitor array. For this, the reference transfer switch units 140a and 140b include a plurality of switches corresponding to the plurality of reference voltage application capacitors and the offset voltage injection capacitors. In the example of FIG. 1, the reference transfer switch units 140a and 140b include 24 switches in order to control the 11-bit differential capacitor array and the offset voltage injection capacitors. The respective switches selectively connect the corresponding capacitors to the reference voltage or the common mode voltage in response to a control signal of the successive approximated register logics (SAR Logics) 170a and 170b.

The comparator 150 compares the output voltages of the capacitor arrays. That is, the comparator 150 compares top plate voltages of the capacitor arrays 120a and 120b, outputs 1 if the voltage of the capacitor array 120a is higher than the voltage of the capacitor array 120b, and otherwise outputs 0. Since the purpose of the example of FIG. 1 is to describe an example in which the resolution of the digital converter increases from 10 bits to 12 bits, the comparator 150 illustrated in FIG. 1 has a resolution of 10 bits.

The delay cell 160 operates the capacitor arrays having differential structures in an asynchronous mode. Thus, since the successive approximated register analog-to-digital converter illustrated in FIG. 1 conforms to the asynchronous mode, the successive approximated register analog-to-digital converter does not separately require a high-speed external clock.

The successive approximated register logics (SAR Logics) 170a and 170b control operations of the reference transfer switch units 140a and 140b in response to the output signal of the comparator 150. In particular, the successive approximated register logics (SAR Logics) 170a and 170b can control the reference transfer switch units 140a and 140b to select the reference voltage application capacitors in descending order of capacitance based on the capacitances of the plurality of voltage application capacitors 120a and 120b ($C_{11}$, $C_{10}$, $C_9$, $C_8$, $C_7$, $C_6$, $C_5$, $C_4$, $C_3$, $C_2$, and $C_1$).

Meanwhile, when the output of the comparator 150 is abnormal, the successive approximated register logics (SAR Logics) 170a and 170b can control the reference transfer switch units 140a and 140b to apply the reference voltage to the bottom plates of the offset voltage injection capacitors ($C_{offset}$) 130a and 130b. For this, the successive approximated register logics (SAR Logics) 170a and 170b may determine that the comparator 150 is abnormal when the output signal of the comparator 150 is not generated for a predetermined comparator operating time, and perform control so that the offset voltage is applied a preset number of times (for example, twice) per cycle. That is, the successive approximated register logics (SAR Logics) 170a and 170b control ON/OFF of the switches connected to the offset voltage injection capacitors ($C_{offset}$) 130a and 130b to apply the offset voltage to the offset voltage injection capacitors ($C_{offset}$) 130a and 130b. In this case, the resolution of the analog-to-digital converting unit increases by the number of times the offset voltage is injected. For example, when the offset voltage is applied twice to the analog-to-digital converting unit having a resolution of 10 bits, the resolution can increase to 12 bits.

Figure 7A:
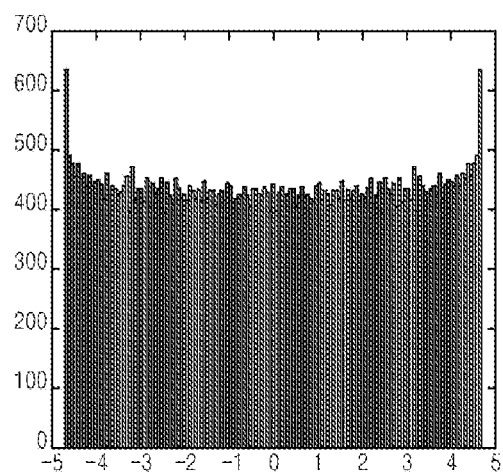
FIGS. 7(a) and 7(b) (collectively referred to as "FIG. 7) provide an illustration illustrating a simulation result for determining a value of an offset voltage to be injected.
Figure 7B:
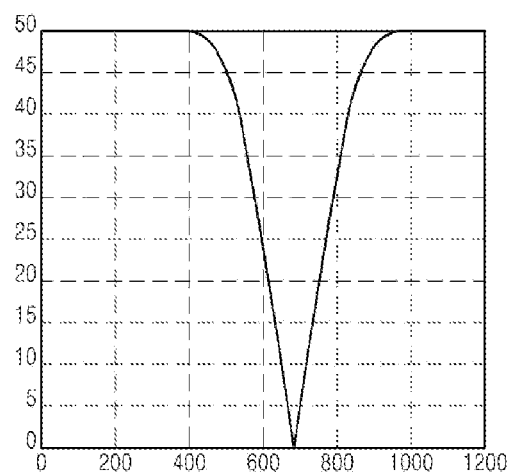

Further, in some scenarios, the successive approximated register logics (SAR Logics) 170a and 170b obtain a voltage value at which a bit error rate (BER) according to an value of the offset voltage is close to 0, and perform control so that the voltage value is applied as the offset voltage. For this, a MATLAB simulation was performed, and a result of the MATLAB simulation is illustrated in FIG. 7 (referring to FIGS. 7(a) and 7(b) collectively). The result will be described below with reference to FIG. 7.

FIG. 7(a) illustrates an input signal applied to a MATLAB model. FIG. 7(b) illustrates the bit error rate (y axis) according to the value of the offset voltage (x axis). Accordingly, it can be seen from FIGS. 7(a) and 7(b) that there is an optimal value of the injected offset voltage. The bit error rate is close to 0 when 8-LSB is applied. This result may be changed according to a structure and a resolution of an analog-to-digital converter to be used.

Figure 2:
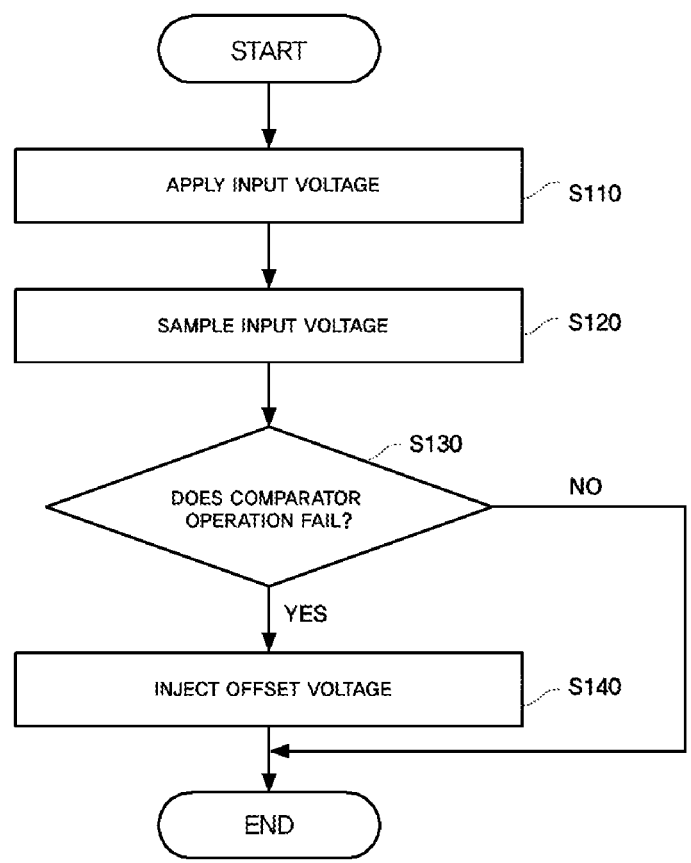
FIG. 2 is a flowchart of a process in a successive approximated register analog-to-digital conversion method.

FIG. 2 is a flowchart of a process in a successive approximated register analog-to-digital conversion method. Referring to FIGS. 1 and 2, the analog-to-digital conversion method using a successive approximated register analog-to-digital converter is as follows.

First, in step S110, an input voltage is applied. That is, the first and second analog signals INP and INN are input to the bootstrapping unit 110. In this case, the first and second analog signals INP and INN are differential signals.

In step S120, in response to the input of the first and second analog signals INP and INN, the bootstrapping unit 110 settles the first and second analog signals INP and INN in the capacitor arrays having a differential structure. Then, the capacitor arrays having a differential structure samples the first and second analog signals INP and INN.

In step S130, when the comparator 150 compares the sampled differential signals with each other, the successive approximated register logics (SAR Logics) 170a and 170b determine whether a result of the comparison is normal to determine whether or not the comparator operation fails. In this case, the comparator 150 may compare the top plate voltage of the capacitor array 120a with the top plate voltage of the capacitor array 120b and output a result of the comparison, and the successive approximated register logics (SAR Logics) 170a and 170b may determine that the result of the comparison is abnormal when the result of the comparison is not generated for a predetermined standby time (for example, a normal operating time of the comparator 150).

In step S140, if the comparison result of the step S130 is abnormal, the successive approximated register logics (SAR Logics) 170a and 170b inject the offset voltage into the sampled signal. That is, the successive approximated register logics (SAR Logics) 170a and 170b control ON/OFF of the switches connected to the offset voltage injection capacitors ($C_{offset}$) 130a and 130b to apply the reference voltage to the bottom plates of the offset voltage injection capacitors ($C_{offset}$) 130a and 130b.

When a voltage containing the offset voltage is output, the comparator 150 repeatedly performs steps S130 and S140 in response to the voltage. When the comparison result in step S130 is output normally, the successive approximated register logics (SAR Logics) 170a and 170b output a digital signal in response to the result (not illustrated). In this case, the successive approximated register logics (SAR Logics) 170a and 170b may repeatedly perform steps S130 and S140 a preset number of times (for example, twice) per cycle.

Further, the successive approximated register logics (SAR Logics) 170a and 170b may further perform the step of obtaining the voltage value at which the bit error rate (BER) according to the value of the offset voltage is close to 0 (for example, MATLAB simulation), and then perform control so that the obtained voltage value is applied as the offset voltage.

FIGS. 3 to 6 are diagrams illustrating a case in which the offset voltage is injected and results thereof in the successive approximated register analog-to-digital converter. While the successive approximated register analog-to-digital converter has been designed for a differential mode, a single mode is assumed for convenience of description with reference to FIGS. 3 to 6. Meanwhile, FIGS. 3(a) to 6(a) illustrate a voltage (that is, a CDAC point of view) of the top plate (a node connected to an input of the comparator) of the capacitor array. FIGS. 3(b) to 6(b) illustrate an output (that is, a comparator point of view) of the comparator when the voltage in FIGS. 3(a) to 6(a) is applied to the comparator. Further, the thick horizontal lines at the centers of FIGS. 3 to 6 indicate a threshold voltage of the comparator.

Figure 3A:
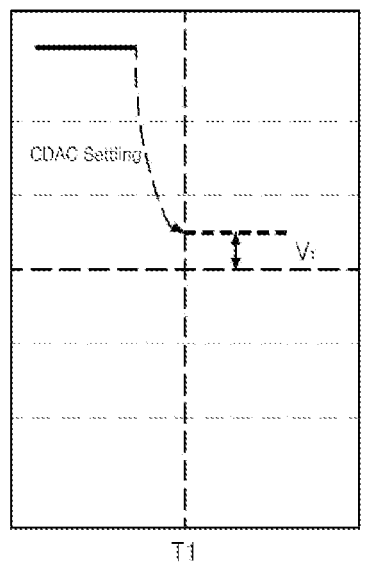
FIGS. 3(a), 3(b), 4(a), 4(b), 5(a), 5(b), 6(a) and 6(b) are diagrams illustrating a case in which an offset voltage is injected, and results thereof in the successive approximated register analog-to-digital converter.
Figure 3B:
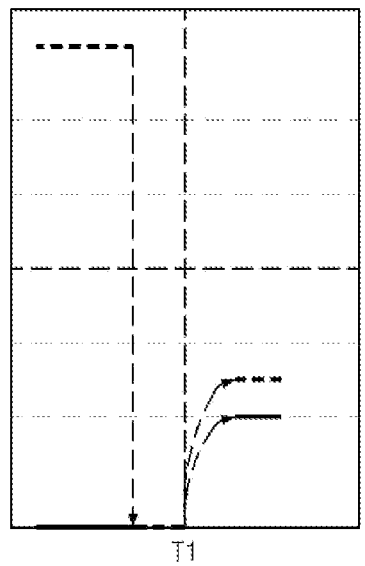

First, FIG. 3 (i.e., FIGS. 3(a) and (b) collectively) illustrates a case in which an input voltage is higher than the threshold voltage of the comparator. Referring to FIG. 3(a), a voltage (CDAC settling voltage) applied to the comparator before a time division line T1 is sufficiently higher than the threshold voltage of the comparator. Accordingly, the output voltage of the comparator is output without any problem, as shown before the time division line T1 in FIG. 3(b). However, referring to a graph after the time division line T1 in FIG. 3(a), the top plate voltage of the CDAC is close to the threshold voltage of the comparator, a difference $V_1$ between the threshold voltage of the comparator and the top plate voltage of the CDAC is very small, and accordingly, the comparator cannot complete a magnitude comparison process for a predetermined operating time. That is, the comparator outputs the voltages indicated by a dotted line and a solid line respectively, as illustrated after the time division line T1 in FIG. 3(b), which means that the comparator cannot compare the input voltages. Eventually, an error is generated in the output of the comparator.

The intentional offset voltage is injected when the difference $V_1$ between the threshold voltage of the comparator and the top plate voltage of the CDAC is too small for the comparator to complete the magnitude comparison process for a determined operating time, as shown after the time division line T1 in FIG. 3.

Figure 4A:
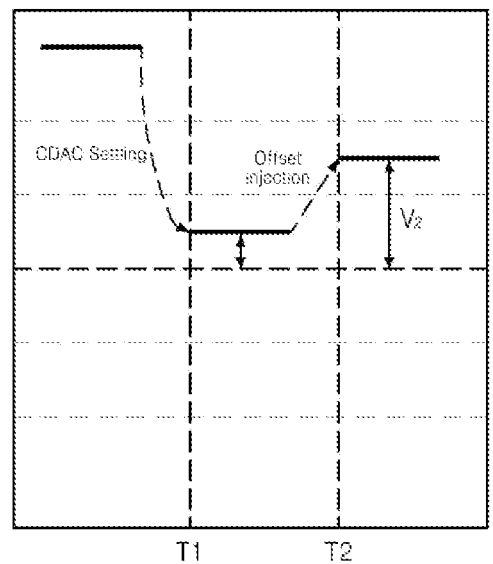
Figure 4B:
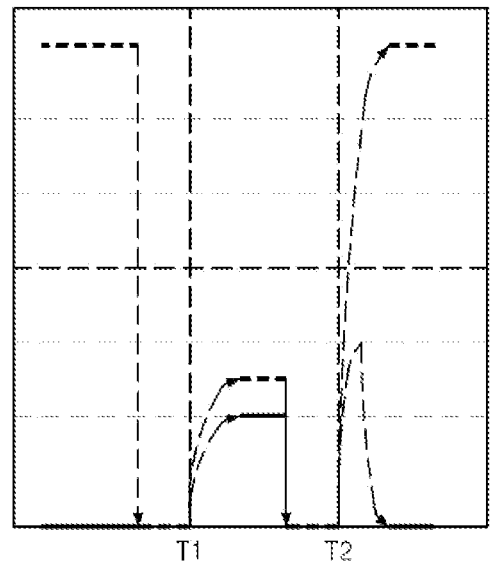

An example in which the offset voltage is intentionally applied as above is illustrated in FIG. 4 (i.e., FIGS. 4(a) and 4(b) collectively). Referring to FIG. 4, states before and after a first time division line T1 in FIGS. 4(a) and 4(b) are the same as the states before and after the time division line T1 in FIGS. 3(a) and 3(b). However, when the comparator cannot operate normally as shown after the first time division line T1 and the offset is accordingly injected, the state is changed as shown after the second time division line T2 and the comparator accordingly operates normally. That is, when the offset voltage is injected into the top plate voltage of the CDAC close to the threshold voltage of the comparator, the state is changed as illustrated after the second time division line T2 in FIG. 4(a) and a difference $V_2$ between the top plate voltage of the CDAC and the threshold voltage of the comparator is great, the comparator operates normally. That is, it can be seen that the output of the comparator is changed as shown after the second time division line T2 in FIG. 4(b), and accordingly, the comparator operates normally. If the comparator operates normally due to the injection of the offset, this means that the top plate voltage of the CDAC is higher than the threshold voltage of the comparator.

Figure 5A:
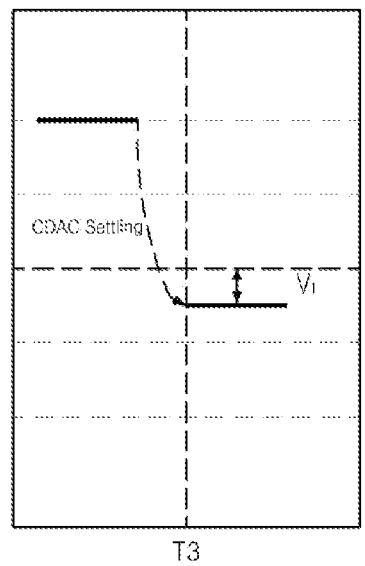
Figure 5B:
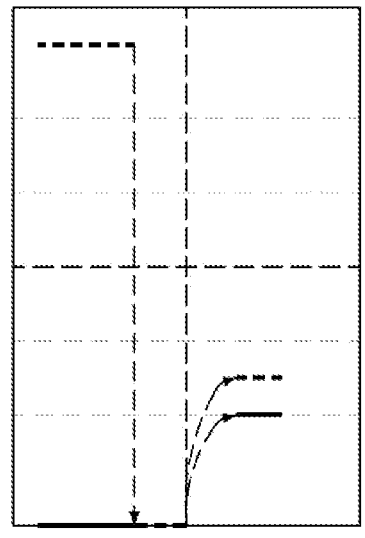
Figure 6A:
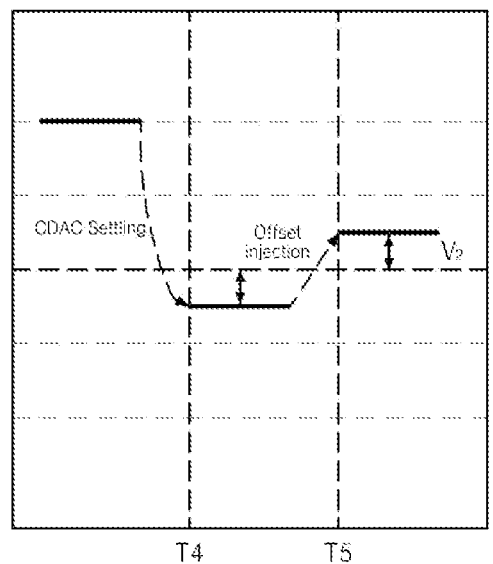
Figure 6B:
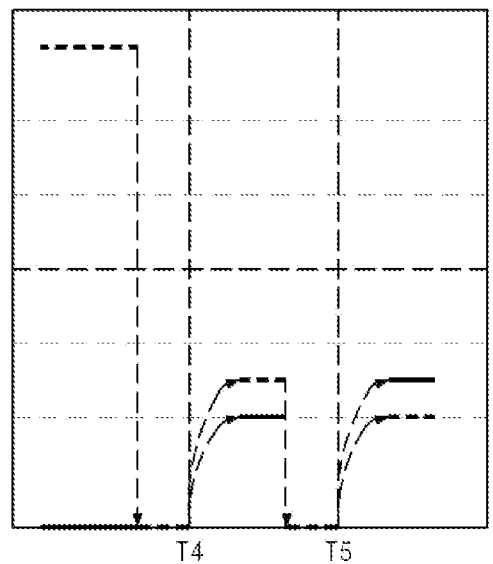

Meanwhile, FIGS. 5 and 6 (where FIG. 5 refers to FIGS. 5(a) and 5(b) collectively, and FIG. 6 refers to FIGS. 6(a) and 6(b) collectively) illustrate a case in which the top plate voltage of the CDAC is lower than the threshold voltage of the comparator. Referring to FIGS. 5(a) and 5(b), because a voltage (CDAC settling voltage) applied to the comparator is sufficiently higher than the threshold voltage of the comparator before a time division line T3, an output voltage of the comparator is output without any problem as shown before the time division line T3 in FIG. 5(b). However, referring to a graph after the time division line T3 in FIG. 5(a), the top plate voltage of the CDAC is close to the threshold voltage of the comparator, and a difference $V_1$ between the threshold voltage of the comparator and the top plate voltage of the CDAC is very small. Accordingly, the comparator cannot complete a magnitude comparison process for a predetermined operating time. That is, the comparator outputs the voltages indicated by a dotted line and a solid line respectively, as illustrated after the time division line T3 in FIG. 5(b), which means that the comparator cannot compare the input voltages. Eventually, an error is generated in the output of the comparator.

In this case, the offset voltage is intentionally applied as in the example of FIG. 4. A state graph of a result of the application of the offset voltage is illustrated in FIGS. 6(a) and 6(b). Referring to FIGS. 6(a) and 6(b), states before and after a first time division line T3 in FIGS. 6(a) and 6(b) are the same as the states before and after the time division line T3 in FIGS. 5(a) and 5(b). However, when the comparator cannot operate normally as shown after the first time division line T3 and the offset is accordingly injected, the state is changed as shown after a second time division line T4. Referring to FIGS. 6(a) and 6(b), the difference $V_2$ between the top plate voltage of the CDAC and the threshold voltage of the comparator is still small despite the intentional application of the offset voltage in a positive direction (always in the same direction). Accordingly, in this case, the comparator cannot operate normally. If the comparator does not operate normally despite the injection of the offset, this means that the top plate voltage of the CDAC is lower than the threshold voltage of the comparator.

While in the above-described exemplary system, the methods have been described as a series of steps or blocks based on the flowcharts, the present invention is not limited to an order of the steps, and a certain step may be performed in a different order with or at the same time as another step.

Moreover, it will be understood by those skilled in the art that the steps shown in the flowcharts are not exclusive, and other steps may be included or one or more of the steps of the flowcharts may be removed without affecting the scope of the present invention.

What is claimed is:

1. A successive approximated register analog-to-digital converter, comprising:
   a bootstrapping unit that receives and samples first and second analog signals; and
   an analog-to-digital conversion unit that converts the first and second analog signals into digital signals, and outputs the digital signals, the analog-to-digital conversion unit having a resolution increasing in response to an intentionally injected offset voltage;
   wherein the offset voltage is a voltage value at which a bit error rate (BER) according to a value of the offset voltage is close to 0.

2. The successive approximated register analog-to-digital converter according to claim 1, wherein the analog-to-digital conversion unit includes:
   capacitor arrays having a differential structure each including a plurality of reference voltage application capacitors having different capacitances, and an offset voltage injection capacitor;
   a delay cell that operates the capacitor arrays having a differential structure in an asynchronous mode;

reference transfer switch units that apply a reference voltage to the capacitor arrays;

a comparator that compares output voltages of the capacitor arrays; and successive approximated register logics that control operations of the reference transfer switch units in response to an output signal of the comparator, and perform control so that a predetermined voltage is applied to the offset voltage injection capacitors when the output of the comparator is abnormal.

3. The successive approximated register analog-to-digital converter according to claim 2, wherein the reference transfer switch unit includes a plurality of switches corresponding to the plurality of reference voltage application capacitors and the offset voltage injection capacitor, and the plurality of switches selectively connect the corresponding capacitors to a reference voltage or a common mode voltage in response to a control signal from the successive approximated register logics.

4. The successive approximated register analog-to-digital converter according to claim 2, wherein the successive approximated register logics control an operation of the reference transfer switch unit so that a reference voltage is applied to a bottom plate of the offset voltage injection capacitor.

5. The successive approximated register analog-to-digital converter according to claim 2, wherein the successive approximated register logics determine that an output signal of the comparator is abnormal when the output signal of the comparator is not generated for a predetermined comparator operating time.

6. The successive approximated register analog-to-digital converter according to claim 2, wherein the successive approximated register logics inject an offset voltage a preset number of times per cycle.

7. An analog-to-digital conversion method using a successive approximated register analog-to-digital converter including capacitor arrays having a differential structure, the analog-to-digital conversion method comprising:

a step of sampling first and second analog signals for the capacitor arrays having a differential structure in response to the input of the first and second analog signals;

a first comparison step of comparing the sampled differential signals to each other;

a second comparison step of injecting an offset voltage into the sampled signal when a result of the comparison is abnormal, and then performing comparison with a predetermined voltage again;

a step of outputting a digital signal in response to a result of the first or second comparison; and a step of obtaining a voltage value at which a bit error rate (BER) according to a value of the offset voltage is close to 0;

wherein the second comparison step includes applying the obtained voltage value as the offset voltage.

8. The analog-to-digital conversion method according to claim 7, wherein the first comparison step includes comparing top plate voltages of the capacitor arrays having a differential structure, and outputting a result of the comparison.

9. The analog-to-digital conversion method according to claim 7, wherein the second comparison step includes applying a reference voltage to a bottom plate of the offset voltage injection capacitor.

10. The analog-to-digital conversion method according to claim 7, wherein the second comparison step includes determining that a result of the comparison is abnormal when the result of the comparison is not generated for a standby time as a result of predetermined comparison.

11. The analog-to-digital conversion method according to claim 7, wherein the second comparison step is repeatedly performed a preset number of times per cycle.

* * * * *